(12) United States Patent
Mukherjee et al.

(10) Patent No.: US 7,190,226 B2
(45) Date of Patent: Mar. 13, 2007

(54) ANALOG DELAY CHAIN HAVING MORE UNIFORMLY DISTRIBUTED CAPACITIVE LOADS AND ANALOG DELAY CELL FOR USE IN CHAIN

(75) Inventors: Debanjan Mukherjee, San Jose, CA (US); Jishnu Bhattacharjee, San Jose, CA (US)

(73) Assignee: Scintera Networks, San Jose, CA (US)

( * ) Notice: Subject to any disclaimer, the term of this patent is extended or adjusted under 35 U.S.C. 154(b) by 77 days.

(21) Appl. No.: 10/928,420

(22) Filed: Aug. 27, 2004

(65) Prior Publication Data
US 2006/0044061 A1    Mar. 2, 2006

(51) Int. Cl.
*H03F 3/45*    (2006.01)
(52) U.S. Cl. ...................... 330/253; 330/311
(58) Field of Classification Search ............... None
See application file for complete search history.

(56) References Cited

U.S. PATENT DOCUMENTS

| | | | | | |
|---|---|---|---|---|---|
| 5,418,497 | A | * | 5/1995 | Martin | 331/48 |
| 6,023,192 | A | * | 2/2000 | Didier | 330/254 |
| 6,504,432 | B1 | * | 1/2003 | Rokhsaz | 330/258 |
| 2004/0189387 | A1 | * | 9/2004 | Okamoto | 330/253 |
| 2006/0028275 | A1 | * | 2/2006 | Bhattacharjee et al. | 330/254 |
| 2006/0061415 | A1 | * | 3/2006 | Bhattacharjee et al. | 327/563 |
| 2006/0091954 | A1 | | 5/2006 | Darabi | |

* cited by examiner

*Primary Examiner*—Robert Pascal
*Assistant Examiner*—Krista Flanagan
(74) *Attorney, Agent, or Firm*—MacPherson Kwok Chen & Heid LLP; Gideon Gimlan

(57) ABSTRACT

A tapped delay chain comprises a plurality of delay cells where each cell has at least two output taps: a primary one for feeding forward a delayed signal to a next cell in the chain, and a secondary output tap for feeding a slightly-differently delayed signal to a multiplier unit so that the slightly-differently delayed signal can be multiplied by a weighting coefficient. The split of output taps in each delay cell allows for a corresponding split of loading capacitance. Each output tap of the delay cell is loaded by a smaller capacitance than it would have had to otherwise drive had the split taps been instead lumped together as a common node. The reduced loading capacitance at each of the split taps allows for a wider frequency response range. The tapped delay chain may be used to form a feed-forward equalizer (FFE) which further comprises an adder, and a plurality of multipliers each respectively receiving a delayed input signal ($S_{in}$(delayed)) from a secondary output tap of a respective delay cell in the chain and each outputting a correspondingly delayed and weighted, product signal (Pi) to the adder.

29 Claims, 3 Drawing Sheets

Classical Feed Forward Equalizer (FFE) with Lumped Capacitances

ANALOG DELAY CHAIN HAVING MORE UNIFORMLY DISTRIBUTED CAPACITIVE LOADS AND ANALOG DELAY CELL FOR USE IN CHAIN

FIELD OF DISCLOSURE

The invention related generally to analog delay line with periodically tapped output nodes and more specifically to high frequency applications in which lumped capacitance can have detrimental effects on response bandwidth. The invention relates yet more specifically to high frequency application where the tapped output nodes of the delay chain are to be utilized, by for example, programmably weighting each and summing them so as define a feedforward equalizer (FFE) or the like.

CROSS REFERENCE TO CO-OWNED APPLICATIONS

The following copending U.S. patent applications are owned by the owner of the present application, and their disclosures are incorporated herein by reference:

(A) Ser. No. 10/724,443 filed: Nov. 26, 2003 by Mukherjee et al and originally entitled "Analog Delay Elements";

(B) Ser. No. 10/724,449 filed: Nov. 26, 2003 by Bhattacharjee et al and originally entitled "Digitally Controlled Transconductance Cell"; and (C) Ser. No. 10/698,317 filed: Oct. 30, 2003 by Mukherjee et al and originally entitled "Programmable Passive Inductor".

CROSS REFERENCE TO PATENTS

The disclosures of the following U.S. patents are incorporated herein by reference:

(A) U.S. Pat. No. 6,545,502 issued Apr. 8, 2003 to Dasgupta et al. and entitled "High frequency MOS fixed and variable gain amplifiers"; and (B) U.S. Pat. No. 6,717,467 issued Apr. 6, 2004 to Renous et al. and entitled "Wideband differential amplifier comprising a high frequency gain-drop compensator device".

DESCRIPTION OF RELATED ART

High speed communication links such as optical fiber links or electrically conductive links (e.g., copper links) typically operate at very high serial data rates, 1 Gb/s (one Giga bits per second) to 10 Gb/s for example. If analog processing is desired for the signals transmitted along these high speed links such processing may call for analog circuitry having extremely wide bandwidths. More specifically, if an optical-to-electrical-to-optical repeater is to be constructed that provides high fidelity reconstruction of a series of essentially rectangular pulses that have been passed through a relatively long link (e.g., a fiber link of about 100 meters or greater for the 10 Gb/s rate), the analog bandwidth may be on the order of several GHz. This is so because the frequency domain content of the rectangular pulses often extends to frequencies larger than the maximum bit rate of the transmission itself. Typically the 3 dB drop-off frequency will be rated at about 70% of the maximum bit rate for providing a good-fit solution to the tradeoff between filtering away high-end noise and minimizing inter-symbol-interference (ISI). Special analog design strategies may be needed for processing electrical signals with these types of constraints.

One known type of analog signal processing uses a periodically-tapped delay line. Each tap feeds a respective one of plural programmable multipliers. Each multiplier further receives a respective multiplying coefficient ($M_i$) and outputs a coefficient weighted version ($M_i \cdot S(t-T_i/k)$) of the delayed signal it has received from the tapped delay line. An adder may then sum together the delayed and weighted signals so as to provide a desired type of filtering function. The combination of the tapped delay line, plural multipliers and adder is sometimes referred to as a feed-forward equalizer (FFE). When the delay taps are equally spaced apart by less than a symbol period (T), the combination is referred to as a fractionally-spaced feed-forward equalizer (FS-FFE, e.g. tau=T/2 or tau=T/3).

A number of problems are associated with FFE's and FS-FFE's. These include how to maintain a desired delay in each stage despite variations associated with temperature, voltage and/or manufacturing deviations (fabrication process variations). Another problem is how to simultaneously provide for linear phase shift over the frequency range of interest. Another problem is how to simultaneously provide for unity gain in each of a series of delay cells while enabling the cells to provide flat magnitude response over the frequency range of interest.

SUMMARY

Structures and methods may be provided in accordance with the present invention for overcoming the above-described problems.

A tapped delay chain in accordance with the invention comprises a plurality of delay cells where each cell has at least two output taps: a primary one for feeding forward a delayed signal to a next cell in the chain, and a secondary output tap for feeding a slightly-differently delayed signal to a multiplier unit so that the slightly-differently delayed signal can be multiplied by a weighting coefficient. The split of output taps in each delay cell allows for a corresponding split of loading capacitance. Each output tap of the delay cell is loaded by a smaller capacitance than it would have had to otherwise drive had the split taps been instead lumped together as a common node. The reduced loading capacitance at each of the split taps allows for a wider frequency response range.

A feed-forward equalizer (FFE) in accordance with the invention comprises the tapped delay chain described above, an adder, and a plurality of multipliers each respectively receiving a delayed input signal ($S_i$(delayed)) from a secondary output tap of a respective delay cell in the chain and each outputting a correspondingly delayed and weighted, product signal ($P_i$) to the adder.

A multi-tapped delay cell in accordance with the invention comprises: (a) first and second symmetrical transistors having respective first and second drain nodes through which sum-constant currents ($I_{d1}+I_{d2}=I_c$) respectively flow; and (b) first and second, symmetrical drain impedances ($Z_{d1}$, $Z_{d2}$) respectively coupled to the first and second drain nodes, where each of the variable drain impedances has a non-negligible inductance (L), a non-negligible capacitance (C) and a non-negligible resistance (R), and where at least first and second output taps are respectively provided at different parts of each respective drain impedance such that loading capacitance for the first and second output taps can be substantially smaller than such loading capacitance would have been had the first and second output taps been merged into a common output tap.

In one embodiment, at least two of the R, L and C components in each drain impedance ($Z_{d1}$, $Z_{d2}$) are programmably adjustable so that an input voltage versus output voltage transfer function of the differential amplifier can be programmably tuned in real time to compensate for variations in temperature and/or supply voltage and to assure that the primary output tap exhibits unity gain. The secondary output tap may advantageously exhibit a gain that is greater than unity.

A method in accordance with the invention comprises continuously tuning each of plural delay cells in a delay chain to provide unity gain between the input of each cell and the input of the next delay cell, where each delay cell has at least two output taps: a primary one for feeding forward a delayed signal to the next cell in the chain, and a secondary output tap for feeding a slightly-differently delayed (differently phased) and differently amplified signal to a multiplier unit so that the slightly-differently delayed signal can be multiplied by a weighting coefficient.

Other aspects of the disclosure will become apparent from the below detailed description.

BRIEF DESCRIPTION OF THE DRAWINGS

The below detailed description section makes reference to the accompanying drawings, in which.

DETAILED DESCRIPTION

Figure 1:
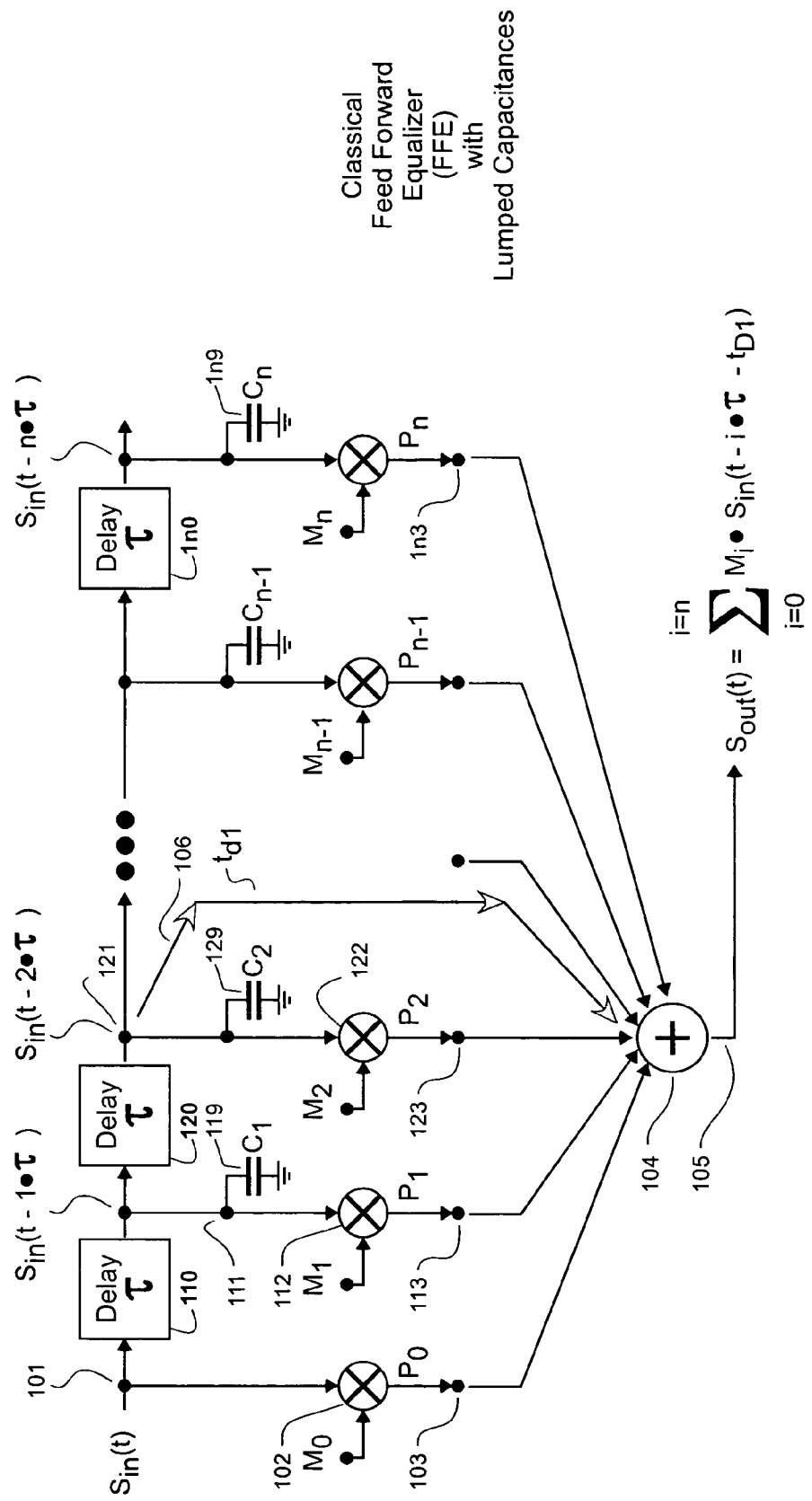
FIG. 1 is a schematic diagram showing a conventional feedforward equalizer (FFE) and identifying a lumped capacitance problem associated with the architecture of such a conventional FFE.

Referring to FIG. 1, an environment 100 in which cascaded delay cells may be employed is first described. Input signal $S_{in}(t)$ may be a wide bandwidth communications signal such as that obtained from passing a series of substantially rectangular signal pulses through a transmission medium (e.g., a continuous fiber optic link) that exhibits signal dispersion. To correct for the dispersion, filtering is employed. In one embodiment, periodically delayed versions, $S_{in}(t-i \cdot T/k)$ of the input signal are generated, where i represents successive ones of a sequential series of whole numbers (0, 1, 2 ..., n), k is a whole number such as 2 or 3, and $\tau=T/k$, where T is a predefined symbol period. The periodically delayed versions of the input signal are respectively multiplied by independent weighting coefficients ($M_i$) and the resulting product signals ($P_i$) are added to produce an adaptively equalized output signal, $S_{out}(t)$. Adaptive equalization may be carried out by changing the weighting coefficients ($M_i$).

More specifically, FIG. 1 shows that the input signal, $S_{in}(t)$ is applied to a first input node 101 of a first delay cell 110. The first input node 101 is also coupled to a first multiplier 102, which receives as its second input a multiplying coefficient $M_0$. The output signal, $P_0$ emerges on node 103 and is supplied as an input to a multi-input adder 104. The output signal $S_{out}(t)$ appears on output line 105 of the adder.

Ideally, the first delay cell 110, and each successive delay cell in the chain, 120, ..., 1n0; provides unity gain and an output delay of time value, $\tau$. The output of the first delay cell 110 couples to a first common node 111, which further connects to the input of the next delay cell 120 and also to the input of the next multiplier 112. Symbol 119 represents the combined capacitance, $C_1$, at node 111 corresponding to the capacitances of the output of the first delay cell 110, the input of the second delay cell 120, the input of the second multiplier 112 and the interconnect routing associated with these terminals, where the effective combined capacitance, $C_1$, can be parasitic in nature and/or intentionally designed in. The output of the second multiplier 112 feeds into input terminal 113 of adder 104. A similar pattern continues for the next successive delay cell and so on. Schematic symbol 129 represents the lumped capacitance, $C_2$ for node 121, this corresponding to the capacitances of the output stage of the second delay cell 120, the input of the third multiplier 122 and the input of the next delay cell (not shown). The actual delay which each of the summed signals experiences includes the plurality of i delay cells the original $S_{in}(t)$ passes through, plus a commonly-attributed delay, $t_{d1}$ associated with passing through the respective multiplier (e.g. 122) and through the summing unit 104 before emerging as part of the final sum on line 105. Symbol 106 represents this commonly associated delay, $t_{d1}$. The actual output signal on line 105 may be represented by the following equation, Eq. 1:

$$S_{out}(t) = \sum_{i=0}^{i=n} M_i \cdot S_{in}(t - i\tau - t_{D1}) \qquad \text{Eq. 1}$$

Of importance, the frequency response of each delay stage, 110, 120, ..., 1n0 depends on the magnitude of the lumped capacitances $C_i$ at its input and output nodes, such as those schematically shown at 119, 129, ..., 1n9. If each lumped capacitance, $C_i$ is relatively large, then a greater amount of current will be shunted to ground as frequency increases and the maximum response frequency of the system becomes relatively small. On the other hand, if the lumped capacitance at each common node (e.g., 111) can be made substantially smaller, then less current will be shunted to ground at higher frequencies and the effective bandwidth of the circuit may be made comparatively larger. Reducing the lumped capacitance, $C_i$ is difficult because three terminals meet at the common node 111, namely, the output terminal of the preceding delay cell 110, the input terminal of the next successive delay cell 120 and the input terminal of the associated multiplier 112. Each of these input/output terminals has some amount of parasitic capacitance associated with it and therefore it is not possible to eliminate these sources of additive capacitance under the illustrated architecture 100 of the so-called feedforward equalizer (FFE).

Figure 2:
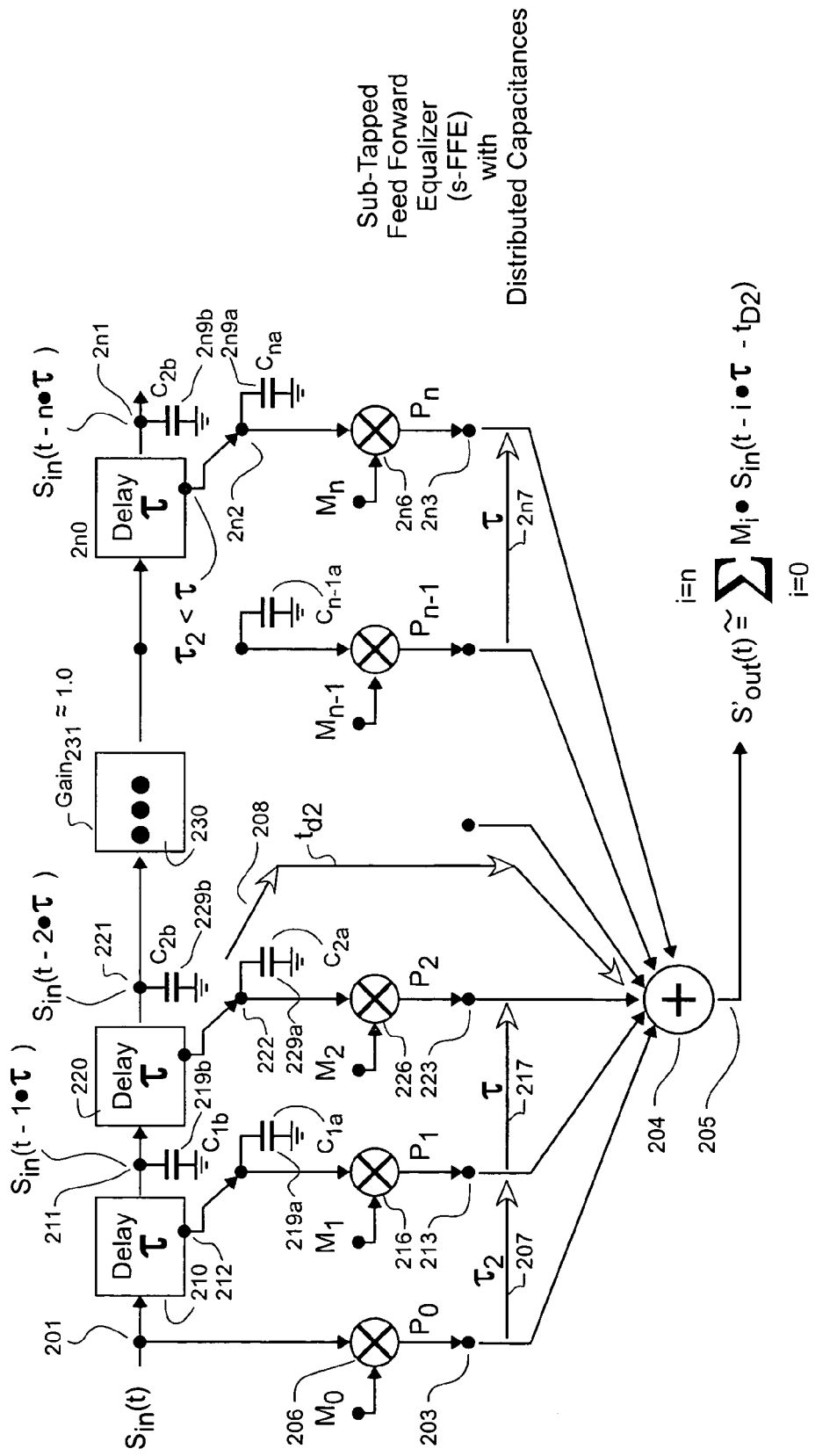
FIG. 2 is a schematic diagram showing a split-taps, feedforward equalizer (st-FFE) in accordance with the invention.

Referring to FIG. 2, an improved structure 200 in accordance with the invention is shown. Each delay cell has at least two output taps rather than just one. For example, the first delay cell in the chain 210 has a first output tap 211 coupling it to the next delay cell 220 and a separate, second output tap 212 coupling it to multiplier 216. Different primary and secondary delays, $\tau$ and $\tau_2$, are associated respectively with the first and second output taps, 211 and 212. The parasitic capacitance associated with the first output node 211 is of quantity $C_{1b}$ (219b) while the parasitic capacitance associated with second output node 212 is of quantity $C_{1a}$ (219a). It is understood that at least one, and typically each of $C_{1a}$ and $C_{1b}$ is less than the combined node capacitance $C_1$ (119) of FIG. 1. Accordingly, because the distributed node capacitances 219a, 219b of the structure shown in FIG. 2 are generally smaller than the lumped node capacitance 119 (FIG. 1), the upper bandpass frequency of the delay circuit and multipliers of FIG. 2 can be increased relative to the upper bandpass frequency of the circuit 100 shown in FIG. 1. In one embodiment, the secondary delay, $\tau_2$ (207) is approximately 10 pico-seconds (10 ps) as measured between the product output node 203 ($P_0$) of the first stage and the product output node 213 ($P_1$) of the second stage. The primary delay, $\tau$ (217) is a larger quantity, of about 30–40 pico-seconds in the one embodiment where $\tau_2$ (207) is approximately 10 ps. The primary delay, $\tau$ (217) may be measured as the effective signal delay between product output nodes 213 ($P_1$) and 223 ($P_2$). The larger, primary delay $\tau$ (represented schematically by arrow-tipped lines 217 and 2n7) is the one that dominates the sum of periodically delayed signals output on line 205. Thus the primary delay, $\tau$ primarily determines the frequency-domain response of the circuit 200. In one embodiment, the larger, primary delay, $\tau$ (217, 2n7) is approximately ⅓ of a symbol period (T), which in the case of a bit period of T=100 pico-seconds is approximately 30 to 40 ps.

Figure 3:
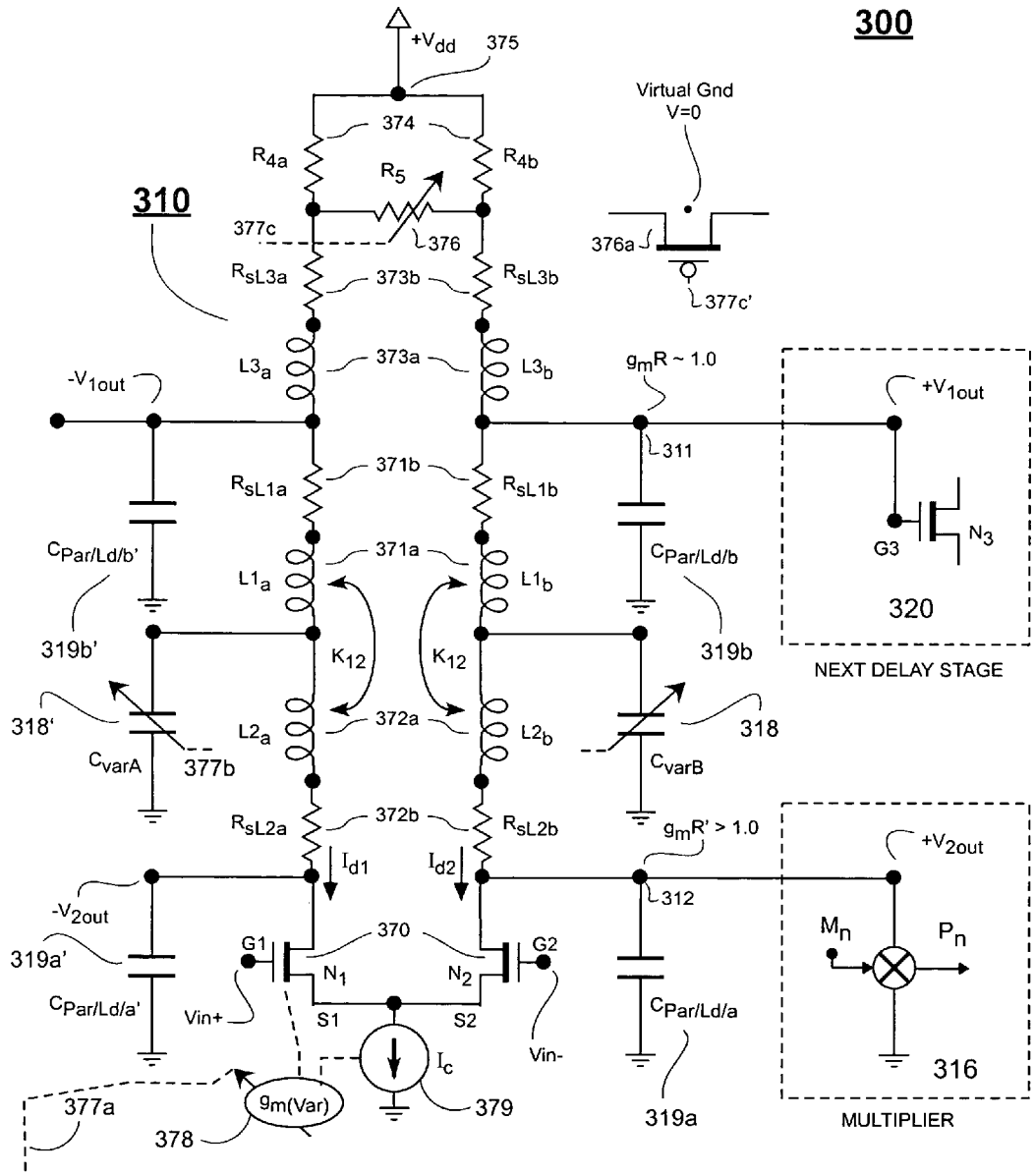
FIG. 3 is a schematic diagram showing a variable-$g_m$ and variable-RLC differential amplifier having multiple output taps for use in a split-taps delay chain such as the one shown in FIG. 2.

Although FIG. 2 shows the secondary subtaps, 212, 222, ..., 2n2 as each being coupled to a respective, programmable multiplier, 216, 226, ..., 2n6; it is within the contemplation of the disclosure for the secondary subtaps, 212, 222, ..., 2n2 to instead more generically couple to any appropriate, follow-on unit which is to process the correspondingly delayed signal (e.g., $S_{in}(t-\tau_2)$) as may be desired while avoiding the penalty of having lumped capacitances from joining both the follow-on unit (112 in FIG. 1) and the next delay cell (120 in FIG. 1) to a common node (111 in FIG. 1). It is further within the contemplation of the disclosure for there to be more than just two subtaps (e.g., 211, 212) per delay cell. A plurality of such subtaps may be provided in each delay cell as will become more apparent when FIG. 3 is detailed. The number of subtaps per delay cell may vary depending on application. In some applications it may be desirable to provide a number of different, follow-on functions for each delay cell such as a follow-on multiplication (216), and a separate, follow-on addition (not shown) and/or a separate, follow-on other function where the penalty of added-on and lumped capacitance is avoided by attaching the follow-on function-providing units (e.g., 216) to separate subtaps of the given delay cell.

In the FFE configuration shown in FIG. 2, it is generally desirable to maintain the base gain of each delay cell, 210, 220, 230, ..., 2n0, at approximately unity ($g_m R \sim 1$) so that there will be essentially no increase or decrease in signal strength as an input signal, $S_{in}(t)$ cascades through a programmably-chosen number of delay cells. Otherwise, a cascaded change of signal strength will skew the weighting coefficients $M_0$–$M_n$ that actually define the summed result produced on output line 205. It will be seen that one of the advantages of the multiply-tapped delay cells 210, 220, etc. is that the unity gain factor of each given cell (e.g., Gain$_{231}$ of cell 230) can be assured for the first tapped output 211 separately from the specific output gain provided at the secondary tapped output 212. In one embodiment, the output gain of the secondary tapped outputs 212, 222, ..., 2n2 is greater than unity, thereby reducing the need to have a larger multiplier factor, $M_1, M_2, \ldots, M_n$ at each of the respective, follow-on multipliers 216, 226, ..., 2n6. In summary, FIG. 2 shows a feedforward equalizer (FFE) having sub-tapped delay cells and smaller distributed capacitances at the sub-tapped output nodes.

Referring to FIG. 3, a delay cell 310 in accordance with the invention is shown as part of an FFE 300. This multiply-tapped delay cell 310 is of a differential amplifier configuration. It has symmetrical transistors 370 ($N_1$, $N_2$) opposingly disposed to feed the sum of their respective drain currents $I_{d1}$, $I_{d2}$ to a common current source 379. The magnitude of the common current, $I_c$ is programmably adjustable as are the number of different-width transistors participating to form each of N1 and N2. This provides for a variable trans-conductance control as is indicated at 378. Control signal 377a may be used to adjust the overall, base gain of the delay cell 310 (voltage gain at 0 Hz) by varying the transconductance ($g_m$) as a function of one or more of the number and channel widths of transistors participating to form each of N1 and N2 and the magnitude of the common current, $I_c$. The variable transconductance control 377a may thus be used to control the delay cell 310 so that the primary base gain, at its primary output node 311 will be approximately unity. In one embodiment, the base gain at the secondary tapped output node 312 is substantially greater than unity (e.g., about 1.2 or greater).

The respective drain impedances of the differentially-opposed transistors, $N_1$ and $N_2$, are symmetrically identical. Each drain impedance includes a series of inductors. For example, the drain impedance of $N_1$ includes the illustrated inductances, $L1_a$, $L2_a$, and $L3_a$. The drain impedance of $N_2$ correspondingly includes the illustrated inductances, $L1_b$, $L2_b$, and $L3_b$. In one embodiment inductors $L1_a$ and $L2_a$ include vertically stacked spiral coils disposed vertically above one another in different, insulatively spaced apart metal layers (conductive interconnect layers) of an integrated circuit and mutually coupled to each other by a coupling factor $K_{12}$ having a value of approximately one. It is believed, that a mutual coupling factor of $K_{12}$ of approximately unity provides the most physically compact structure for maximizing the effective, combined inductance of $L1_a$ and $L2_a$. The third drain inductor $L3_a$ does not have to be mutually coupled to the other two inductances $L1_a$ and $L2_a$, of the respective $N_1$ drain impedance. Each of the coils typically has associated with it a parasitic series resistance such as illustrated at 371b, 372b, and 373b.

In addition to the inductors and their respective, parasitic series resistances (optional), an intentional drain resistance 374 is included in the series path of each of the drain currents, $I_{d1}$ and $I_{d2}$. The intentional drain resistance 374 includes a portion ($R_{4a}$, $R_{4b}$) separating the remainder of the respective drain impedance from the power rail node 375 (+$V_{dd}$). In one embodiment, a programmably-variable resistance 376 ($R_5$) is provided between the lower nodes of $R4_a$ and $R4_b$ (the opposed 374 resistances) for adjusting the effective base gain, $g_m R$, of the primary output node 311. In one embodiment each of $R4_a$ and $R4_b$ is approximately 100 ohms plus or minus 5 ohms. The exact resistance may vary as a function of fabrication process and/or temperature. Adjustment of variable resistance $R_5$ may be used to cause the effective, primary base gain of the amplifier, $g_m R$ to be approximately unity at node 311. The base gain at output node 311 is the gain at 0 Hz frequency, which is simply the effective DC drain resistance, as seen by each of the opposing drain currents $I_{d1}$ and $I_{d2}$ multiplied by the effective transconductance ($g_m$) of the differential amplifier. Because $I_{d1}$ and $I_{d2}$ oppose each other by a differential amount so as to sum to the magnitude of the common current $I_c$ (379) there will be a virtual ground (V=0) somewhere in the mid-point of resistance $R_5$ (376). A variable voltage divider is therefore created for each of the drain legs between the virtual ground and the $+V_{dd}$ voltage level of node 375. The schematic symbol at 376a indicates that variable resistance $R_5$ may be implemented as a single P-channel MOS transistor. Gate control signal 377c' may be used to programmably vary the resistance of transistor 376a. An advantage of such a structure is that it is more compact and it automatically generates its own virtual ground (V=0) without having to adjust for process variations and temperature variations about a true ground node.

As seen in FIG. 3, there are three distributed capacitances associated with each drain impedance, for example, capacitances 319a, 319b, and 318 for the drain impedance of $N_2$. The capacitance value, $C_{var}$ of capacitance 318 is programmably variable (and capacitance 318' of $N_1$ tracks it by symmetry) while the respective capacitance values of 319a, 319b are dependent on parasitic attributes such as the front-end capacitances of the corresponding multiplier 316 and next delay stage 320. Programmable adjustment of the capacitance value, $C_{var}$ of capacitance 318 may be used to achieve a desired primary delay, $\tau$ (217, e.g., $\tau=T/3$) irrespective of changes in temperature, supply power (+Vdd) or variations in fabrication process. Although not fully shown in FIG. 3, it is understood that each of the next delay stage 320 and corresponding multiplier 316 is a differential input device and accordingly the $-V_{1out}$ signal across capacitance 319b' couples to the differential counterpart of transistor $N_3$ (in next stage 320) and the $-V_{2out}$ signal across capacitance 319a' couples to the differential counterpart of the illustrated, $+V_{2out}$ input of corresponding multiplier 316. Capacitance 319a' therefore encompasses the parasitic or other loading capacitances of the corresponding multiplier 316, of routing interconnect and of the parasitic or other associated capacitances of the drain node of transistor $N_1$. Capacitance 319a similarly encompasses the parasitic or other loading capacitances of the plus input terminal of multiplier 316 and of routing interconnect and of the parasitic or other associated capacitances of the drain node of transistor $N_2$.

Because prediction of the frequency response of the illustrated differential amplifier 310 can be relatively complex, it is advisable to use computer simulation for determining the values of the various illustrated parameters for realizing a desired frequency-domain transfer function. It has been found that the ratio of the inductances of the first inductor 371a to the second inductor 372a should be made a function of the nominal expected capacitances of parasitic capacitances 319a, 319b, as well as the mid range capacitance of the variable capacitance 318. Thus, $$L1/L2 = f(C_{para}, C_{var}, C_{parb}) \quad \text{Eq. 2.}$$

The programmably-variable capacitance, $C_{var}$ (318 and 318') may be programmably varied by use of control signal 377b to compensate for changes in temperature, for fabrication process variations and for changes in supply voltage $(+V_{dd})$ so that the frequency response from one delay cell to the next is approximately the same and provides a generally flat response across the frequency range of interest. Variable resistance $R_5$ (376) is also programmably variable to provide an essentially unity based gain at output node 311. Thus control signals 377a, 377b and 377c may be used to fine tune the base behavior (0 Hz) and higher frequency behavior of the delay cell 310. Control signals 377a, 377b and 377c may be the same or individualized for each of the cascaded delay cells (310) populating FFE 300. In one embodiment, the input and output terminals of one exemplary delay cell or of a few coupled in series, are coupled to a comparator. The exemplary delay cell(s) may receive a DC reference level and/or an AC envelope. The comparator periodically or continuously determines if the absolute difference between input and output envelope magnitudes (or levels) exceeds a predetermined threshold. Ideally they should be exactly the same if the per-cell gain is exactly one. If the threshold is exceeded, adjustment signals of appropriate magnitude and polarity are generated for adjusting one or more of control signals 377a, 377b and 377c for thereby returning the per-cell base gain (of the output tap corresponding to node 311) closer to unity.

The DC voltage developed at primary output node 311 will be approximately $V_{dd}-I_{d2}\cdot R_{4b}$ (assuming $R_5$ is very large and $R_{sL3a/b}$ is negligible). Because the parasitic series inductance resistances of L1 and L2, namely, resistances 371b and 372b, appear below node 311, the voltage output at the secondary tap 312 will have a higher base gain of $g_m\cdot(R+R_{sL1b}+R_{sL2b})$. In one embodiment, this secondary tap output gain is about 20% greater than unity. Of course, additional resistances may be added in series below node 311 and/or the resistances of the L1 and L2 coils may be purposefully made larger to further increase the base gain of the secondary tap output 312. Because the gain of the secondary tap output 312 can be made greater than one, the subsequent multipliers such as 316 do not have to provide as much of a gain as they otherwise would for achieving a desired weighting factor greater than one. The gain of differential amplifier based, delay unit 310 may therefore be used for simultaneously providing both a weighted gain (>1) at secondary output node 312 and a unity gain at primary output node 311. Thus two functions are provided from a single compact structure 310. Energy is conserved in the extent that the follow-on multipliers (316) do not have to provide greater boosting for attaining the desired weighting coefficient. The delay cell provides some of that as a pre-boost.

Methods for providing variable capacitances such as for capacitances 318 and 318' of FIG. 3 are well known and need not be detailed here. Discrete switches may be used in combination metal-insulator-metal (MIM) capacitors and/or voltage sensitive or insensitive MOS capacitors may be used. It is worthy to note that the capacitance-setting switches should be appropriately sized so as to reduce their series resistance. Increasing transistor size also tends to increase the parasitic capacitance. Thus, reduction of switch resistance and switch capacitance trade off with each other.

Methods for providing variable transconductance ($g_{mVar}$) are disclosed for example in the above-cited U.S. Ser. No. 10/724,449 (Digitally Controlled Transconductance Cell, which disclosure is incorporated herein by reference). Briefly, and as already mentioned, the number of transistors (e.g., different sized transistors) participating in each of the symmetrical branches of the differential amplifier (310) is programmably changed and/or the magnitude of the common constant current (379) is programmably changed. This has the effect of changing the amplifier's transconductance, $g_{mVar}$.

Methods for providing variable inductances may also be used if desired, for tuning one or more of the inductances (L1, L2 and L3) in the delay cell 310 of FIG. 3. These methods may include a programmable switching in and out of additional inductors and/or changing the mutual inductance between L1 and L2. Such methods are disclosed for example in the above-cited U.S. Ser. No. 10/698,317 originally entitled "Programmable Passive Inductor" and incorporated herein by reference.

In conclusion it is seen that a space and energy efficient solution has been provided for reducing shunt capacitance at periodic nodes of a delay chain and for implementing feedforward equalizers (FFE's). The same cells may be simultaneously used both for generating a delayed, unity gain version of the input signal (at node 311) and for generating an amplified and differently delayed, version of the input signal (at node 312). Energy is conserved because part of the signal boost desired in follow-on multipliers (316) is already provided by the delay cells. Also, it may be shown that inductive drain boosting (where inductances such as 371, 372 and 373 are placed in series within the conduction paths of the drain currents, $I_{d1}$ and $I_{d2}$) is a more energy efficient way than alternatives for compensating for losses in shunt capacitances as frequency increases. Thus a relatively broadband response can be attained.

The present disclosure is to be taken as illustrative rather than as limiting the scope, nature, or spirit of the subject matter claimed below. Numerous modifications and variations will become apparent to those skilled in the art after studying the disclosure, including use of equivalent functional and/or structural substitutes for elements described herein, use of equivalent functional couplings for couplings described herein, and/or use of equivalent functional steps for steps described herein. Such insubstantial variations are to be considered within the scope of what is contemplated here. Moreover, if plural examples are given for specific means, or steps, and extrapolation between and/or beyond such given examples is obvious in view of the present disclosure, then the disclosure is to be deemed as effectively disclosing and thus covering at least such extrapolations.

If any disclosures are incorporated herein by reference and such incorporated disclosures conflict in part or whole with the present disclosure, then to the extent of conflict, and/or broader disclosure, and/or broader definition of terms, the present disclosure controls. If such incorporated disclosures conflict in part or whole with one another, then to the extent of conflict, the later-dated disclosure controls.

Unless expressly stated otherwise herein, ordinary terms have their corresponding ordinary meanings within the respective contexts of their presentations, and ordinary terms of art have their corresponding regular meanings within the relevant technical arts and within the respective contexts of their presentations herein.

Given the above disclosure of general concepts and specific embodiments, the scope of protection sought is to be defined by the claims appended hereto. The issued claims are not to be taken as limiting Applicant's right to claim disclosed, but not yet literally claimed subject matter by way of one or more further applications including those filed pursuant to 35 U.S.C. §120 and/or 35 U.S.C. §251.

What is claimed is:

1. A differential amplifier comprising:
   (a) first and second transistors having respective first and second drains through which respective first and second drain currents flow, the sum of the first and second drain currents defining a relative constant;
   (b) first and second variable drain impedances respectively coupled to the first and second drains, each of the variable drain impedances having an inductance (L), a capacitance (C) and a resistance (R), wherein at least two of said R, L and C are adjustable so that a first output voltage versus input voltage transfer function of the differential amplifier can be tuned at least at 0 Hz (base frequency) and at a higher frequency; and
   (c) at least first and second different output tapping terminals provided in each of the first and second variable drain impedances so as to respectively output from each of the first and second variable drain impedances, corresponding first and second output signals having respectively different magnitudes.

2. The differential amplifier of claim 1 wherein:
   one of the first and second output signals has its magnitude adjusted so to define an essentially unity base gain at its corresponding output tapping terminal.

3. The differential amplifier of claim 1 wherein:
   at least said resistance (R) of each of the first and second variable drain impedances is programmably adjustable.

4. The differential amplifier of claim 1 wherein:
   each drain impedance includes at least first and second inductors each respectively connecting to a respective one but not the other of the first and second output tapping terminals of that drain impedance.

5. The differential amplifier of claim 4 wherein:
   each drain impedance includes a variable capacitor coupled between the first and second inductors.

6. The differential amplifier of claim 4 wherein:
   each drain impedance further includes a third inductor interposed between a power rail and said first and second inductors.

7. The differential amplifier of claim 4 wherein:
   said first and second inductors of each drain impedance define a mutually coupled inductive system.

8. The differential amplifier of claim 7 wherein:
   said mutually coupled inductive system has a mutual coupling factor of about one.

9. The differential amplifier of claim 7 wherein:
   the first and second inductors of each of the drain impedances are defined by spiral coils disposed respectively and overlappingly in first and second conductive layers of a monolithic integrated circuit.

10. The differential amplifier of claim 6 and further comprising:
    a variable resistance coupled to both drain impedances.

11. The differential amplifier of claim 1 and further comprising:
    a variable resistance coupled to both drain impedances.

12. The differential amplifier of claim 1 and further comprising:
    variable transconductance means having a transconductance factor that is adjustable independently of the adjustable ones of said at least two adjustable ones of L, R and C for thereby providing the differential amplifier with a variable transconductance factor ($g_{m\,(var)}$).

13. The differential amplifier of claim 1 wherein:
    at least two of said R, L and C are programmably and independently adjustable.

14. A plurality of DC series-connected differential amplifiers where each of two or more of said amplifiers has at least:
    first and second different output tapping terminals in each of complementary current legs of the given differential amplifier, where the first and second output tapping terminals respectively output corresponding first and second output signals having respectively different magnitudes but the same polarity.

15. The plurality of DC series-connected differential amplifiers of claim 14 wherein:
    a base gain of the first output tapping terminal of each of the two or more amplifiers is adjustable to achieve unity base gain at said first output tapping terminal.

16. The plurality of DC series-connected differential amplifiers of claim 15 wherein:

a primary delay provided by the first output tapping terminal of each of the two or more amplifiers is adjustable to achieve a predefined amount of signal delay at said first output tapping terminal.

17. A multi-tapped amplifier comprising:
(a) a first input terminal for receiving a corresponding first input signal having DC and AC components;
(b) a first output tap for outputting a corresponding first output signal that constitutes a first amplification of the first input signal in accordance with a first frequency response characteristic, the first output tap having a first capacitance loading the first output tap;
(c) a second output tap for outputting a corresponding second output signal that constitutes a second amplification of the first input signal in accordance with a second frequency response characteristic, the second output tap having a second capacitance loading the second output tap,
wherein the first and second output signals have the same polarity but the second amplification is different than the first amplification, and
wherein the first and second capacitances respectively define frequency response characteristics of the first and second output taps; and
(d) a common amplification adjuster for commonly adjusting the first and second amplifications.

18. The multi-tapped amplifier of claim 17 wherein:
the amplifier has plural current carrying legs; and
said first and second output taps are disposed along the same current carrying leg of the amplifier.

19. The multi-tapped amplifier of claim 17 wherein:
said common amplification adjuster can adjust the first amplification to a value substantially equal to unity and simultaneously adjust the second amplification to a value greater than unity.

20. The multi-tapped amplifier of claim 17 wherein:
the amplifier has plural impedances for loading respective ones of plural active devices; and
said first and second output taps are disposed in a same one of said plural impedances.

21. The multi-tapped amplifier of claim 20 wherein:
each of said impedances includes first and second inductors coupled in a series circuit and the first output tap couples to the series circuit between the first and second inductors.

22. The multi-tapped amplifier of claim 21 wherein:
each of said impedances includes a variable capacitor coupled to said series circuit.

23. The multi-tapped amplifier of claim 22 wherein:
each of said impedances includes a variable resistance means coupled in series with said series circuit.

24. The multi-tapped amplifier of claim 21 wherein:
each of said impedances includes a variable resistance means coupled in series with said series circuit.

25. The multi-tapped amplifier of claim 24 wherein:
each of said impedances includes a third inductor coupled in series with said series circuit.

26. The multi-tapped amplifier of claim 25 wherein:
said variable resistance means is disposed between a power rail of the amplifier and the inductors in said series circuit.

27. The multi-tapped amplifier of claim 17 wherein:
wherein the first and second output signals are differently delayed and differently amplified versions of the first input signal.

28. The multi-tapped amplifier of claim 27 comprising:
a common delay adjuster for commonly adjusting the delays of the first and second output signals.

29. The multi-tapped amplifier of claim 28 wherein:
said common delay adjuster includes a variable capacitance that is inductively de-lumped from said first and second capacitances of the first and second output taps.

* * * * *